(12) United States Patent
Pytel et al.

(10) Patent No.: US 11,151,752 B1
(45) Date of Patent: Oct. 19, 2021

(54) SYSTEM FOR VISUALIZATION OF A BUILDING MATERIAL

(71) Applicant: CERTAINTEED CORPORATION, Malvern, PA (US)

(72) Inventors: Rachel Z. Pytel, Newton, MA (US); Gregory F. Jacobs, Oreland, PA (US); Robert L. Jenkins, Honey Brook, PA (US); Alex C. Nash, Downingtown, PA (US); Anthony Jouanin, Malvern, PA (US); Brice Dubost, Newton, MA (US); Simon Mazoyer, Paris (FR); Minas R. Apelian, Phoenixville, PA (US)

(73) Assignee: CERTAINTEED LLC, Malvern, PA (US)

( * ) Notice: Subject to any disclaimer, the term of this patent is extended or adjusted under 35 U.S.C. 154(b) by 24 days.

(21) Appl. No.: 16/451,090

(22) Filed: Jun. 25, 2019

Related U.S. Application Data

(63) Continuation of application No. 15/167,240, filed on May 27, 2016, now Pat. No. 10,373,343.

(60) Provisional application No. 62/167,704, filed on May 28, 2015, provisional application No. 62/211,342, filed on Aug. 28, 2015.

(51) Int. Cl.
| | |
|---|---|
| *G06T 11/00* | (2006.01) |
| *G06T 11/60* | (2006.01) |
| *G06F 30/13* | (2020.01) |
| *G06F 3/0484* | (2013.01) |

(52) U.S. Cl.
CPC ............ *G06T 11/001* (2013.01); *G06F 30/13* (2020.01); *G06T 11/60* (2013.01); *G06F 3/04847* (2013.01); *G06T 2200/24* (2013.01); *G06T 2210/04* (2013.01)

(58) Field of Classification Search
None
See application file for complete search history.

(56) References Cited

U.S. PATENT DOCUMENTS

| | | | | |
|---|---|---|---|---|
| 4,736,253 | A * | 4/1988 | Shida ................... | H04N 1/4055 358/2.1 |
| 4,970,666 | A | 11/1990 | Welsh et al. | |
| 4,984,071 | A * | 1/1991 | Yonezawa ............... | G06T 5/009 358/521 |
| 5,175,807 | A * | 12/1992 | Cawley ............... | G06F 3/04845 345/428 |
| 5,389,476 | A * | 2/1995 | Kruchko .................. | B41M 3/12 101/DIG. 36 |
| 5,537,638 | A * | 7/1996 | Morita .................... | G06T 15/04 345/426 |

(Continued)

*Primary Examiner* — Martin Mushambo
(74) *Attorney, Agent, or Firm* — Abel Schillinger, LLP; Thomas H. Osborn

(57) ABSTRACT

A system for rendering a building material comprising a database including an adjustable parameter relating to a characteristic of a contemplated building material, wherein the system is adapted to provide a rendered image of the contemplated building material, wherein the system is adapted to be used in conjunction with manufacturing of the building material, and wherein the rendered image has a ΔE, as measured according to a Color Test with respect to the building material, of less than 10, less than 8, less than 6, less than 5, less than 4, less than 3, less than 2, or even less than 1.

22 Claims, 5 Drawing Sheets

(56) References Cited

U.S. PATENT DOCUMENTS

| | | | | |
|---|---|---|---|---|
| 5,553,859 A * | 9/1996 | Kelly | | A63B 67/02 |
| | | | | 273/338 |
| 5,572,635 A * | 11/1996 | Takizawa | | G06T 15/50 |
| | | | | 345/426 |
| 5,582,961 A * | 12/1996 | Giorgianni | | G03C 5/02 |
| | | | | 430/502 |
| 5,609,978 A * | 3/1997 | Giorgianni | | G03C 7/3041 |
| | | | | 358/505 |
| 5,694,533 A | 12/1997 | Richards et al. | | |
| 5,821,917 A * | 10/1998 | Cappels | | H04N 9/73 |
| | | | | 345/589 |
| 6,313,823 B1 * | 11/2001 | Cappels | | G09G 1/165 |
| | | | | 345/589 |
| 6,320,578 B1 * | 11/2001 | Shiitani | | G06T 15/60 |
| | | | | 345/419 |
| 6,339,429 B1 * | 1/2002 | Schug | | G09G 5/00 |
| | | | | 345/589 |
| 6,744,441 B2 * | 6/2004 | Wu | | G03B 35/00 |
| | | | | 345/582 |
| 6,891,980 B2 * | 5/2005 | Gerhard | | G01N 21/455 |
| | | | | 382/312 |
| 7,068,274 B2 | 6/2006 | Welch et al. | | |
| 7,102,648 B1 * | 9/2006 | Holub | | G06F 3/14 |
| | | | | 345/589 |
| 7,515,160 B2 * | 4/2009 | Kerofsky | | G09G 3/2007 |
| | | | | 345/581 |
| 7,668,334 B2 * | 2/2010 | Reed | | G06T 1/005 |
| | | | | 382/100 |
| 7,728,833 B2 | 6/2010 | Verma et al. | | |
| 7,728,845 B2 * | 6/2010 | Holub | | G01J 3/02 |
| | | | | 345/589 |
| 7,764,286 B1 * | 7/2010 | Kumar | | G06T 11/00 |
| | | | | 345/426 |
| 7,973,796 B1 * | 7/2011 | Marston | | G06T 11/60 |
| | | | | 345/581 |
| 8,077,353 B2 * | 12/2011 | Wada | | H04N 1/6058 |
| | | | | 358/1.9 |
| 8,339,394 B1 | 12/2012 | Lininger | | |
| 8,427,473 B2 | 4/2013 | Elsberg et al. | | |
| 8,564,607 B2 * | 10/2013 | Lee | | G06T 11/001 |
| | | | | 345/582 |
| 8,749,580 B1 * | 6/2014 | Lininger | | G06F 16/00 |
| | | | | 345/629 |
| 8,872,811 B1 * | 10/2014 | Rump | | G06F 30/20 |
| | | | | 345/418 |
| 9,181,694 B1 * | 11/2015 | Munoz | | E04B 1/34 |
| 2002/0154814 A1 * | 10/2002 | Gerhard | | G01N 21/958 |
| | | | | 382/181 |
| 2003/0007700 A1 * | 1/2003 | Gutta | | H04N 5/23222 |
| | | | | 382/282 |
| 2003/0063084 A1 * | 4/2003 | Burke | | G06T 9/001 |
| | | | | 345/419 |
| 2003/0122843 A1 * | 7/2003 | Lai | | H04N 1/46 |
| | | | | 345/589 |
| 2003/0179915 A1 * | 9/2003 | Goto | | G06T 7/0012 |
| | | | | 382/128 |
| 2004/0012542 A1 * | 1/2004 | Bowsher | | G06T 15/00 |
| | | | | 345/10 |
| 2004/0076315 A1 * | 4/2004 | Scoll | | G06K 9/0014 |
| | | | | 382/128 |
| 2004/0155886 A1 * | 8/2004 | Matsumoto | | G06T 15/04 |
| | | | | 345/582 |
| 2005/0074179 A1 * | 4/2005 | Wilensky | | G06T 5/007 |
| | | | | 382/254 |
| 2005/0134918 A1 * | 6/2005 | Reed | | H04N 1/4078 |
| | | | | 358/3.01 |
| 2005/0141754 A1 * | 6/2005 | Lo | | G06K 9/036 |
| | | | | 382/124 |
| 2005/0243336 A1 * | 11/2005 | Kuhn | | H04N 1/6052 |
| | | | | 358/1.9 |
| 2005/0259034 A1 * | 11/2005 | Harada | | G02B 27/0101 |
| | | | | 345/7 |
| 2006/0232792 A1 * | 10/2006 | Kobayashi | | G06F 3/0421 |
| | | | | 356/621 |
| 2006/0282769 A1 * | 12/2006 | Bronstein | | G06F 40/151 |
| | | | | 715/236 |
| 2007/0035755 A1 * | 2/2007 | Maki | | H04N 1/00411 |
| | | | | 358/1.9 |
| 2007/0216709 A1 * | 9/2007 | Kojima | | G06K 9/6212 |
| | | | | 345/619 |
| 2008/0158142 A1 * | 7/2008 | Zhou | | G09G 3/344 |
| | | | | 345/107 |
| 2009/0046093 A1 * | 2/2009 | Kikuchi | | G01C 21/3638 |
| | | | | 345/419 |
| 2009/0141966 A1 * | 6/2009 | Chen | | G06T 7/33 |
| | | | | 382/154 |
| 2009/0322742 A1 * | 12/2009 | Muktinutalapati | | G06T 7/75 |
| | | | | 345/420 |
| 2010/0060943 A1 * | 3/2010 | Monga | | G06T 1/005 |
| | | | | 358/3.28 |
| 2010/0097407 A1 * | 4/2010 | Zulch | | G09G 5/026 |
| | | | | 345/690 |
| 2010/0123648 A1 * | 5/2010 | Miller | | G09G 3/3208 |
| | | | | 345/76 |
| 2010/0123651 A1 * | 5/2010 | Miller | | G09G 3/3208 |
| | | | | 345/77 |
| 2010/0241406 A1 * | 9/2010 | Rahmes | | G06F 30/13 |
| | | | | 703/1 |
| 2010/0253684 A1 * | 10/2010 | Yang | | G06T 7/90 |
| | | | | 345/426 |
| 2011/0002529 A1 * | 1/2011 | Jeong | | G06T 7/001 |
| | | | | 382/147 |
| 2011/0141497 A1 * | 6/2011 | Willamowski | | H04N 1/00408 |
| | | | | 358/1.9 |
| 2011/0243587 A1 * | 10/2011 | No | | G03G 15/081 |
| | | | | 399/43 |
| 2012/0013635 A1 * | 1/2012 | Beeman | | G09G 3/3607 |
| | | | | 345/590 |
| 2012/0019493 A1 * | 1/2012 | Barnhoefer | | H05B 41/3922 |
| | | | | 345/207 |
| 2012/0041722 A1 * | 2/2012 | Quan | | G06T 17/05 |
| | | | | 703/1 |
| 2012/0050307 A1 * | 3/2012 | Mahowald | | H05B 47/11 |
| | | | | 345/590 |
| 2012/0056911 A1 * | 3/2012 | Safaee-Rad | | G09G 3/2003 |
| | | | | 345/690 |
| 2012/0063680 A1 * | 3/2012 | Daisy | | G06T 3/0068 |
| | | | | 382/165 |
| 2012/0179431 A1 | 7/2012 | Labile et al. | | |
| 2012/0197600 A1 * | 8/2012 | Bai | | G06T 17/00 |
| | | | | 703/1 |
| 2012/0221595 A1 * | 8/2012 | Slowe | | G06Q 30/0282 |
| | | | | 707/769 |
| 2012/0243008 A1 * | 9/2012 | Chatow | | G06F 3/1282 |
| | | | | 358/1.9 |
| 2012/0249536 A1 * | 10/2012 | Sutou | | G06T 7/85 |
| | | | | 345/419 |
| 2013/0002649 A1 * | 1/2013 | Wu | | G06T 19/006 |
| | | | | 345/419 |
| 2013/0069944 A1 * | 3/2013 | Altman | | G09B 29/106 |
| | | | | 345/420 |
| 2013/0120387 A1 * | 5/2013 | Mueller | | G06T 15/04 |
| | | | | 345/426 |
| 2013/0127847 A1 * | 5/2013 | Jin | | G06T 7/564 |
| | | | | 345/420 |
| 2013/0155119 A1 * | 6/2013 | Dai | | G09G 3/3406 |
| | | | | 345/690 |
| 2013/0314410 A1 * | 11/2013 | Gravois | | G06T 19/00 |
| | | | | 345/420 |
| 2013/0328871 A1 * | 12/2013 | Piemonte | | G01C 21/3638 |
| | | | | 345/420 |
| 2013/0343603 A1 * | 12/2013 | Choi | | G06T 5/005 |
| | | | | 382/103 |
| 2014/0043321 A1 * | 2/2014 | Matjasko | | G06T 15/00 |
| | | | | 345/419 |
| 2014/0092068 A1 * | 4/2014 | Zheng | | H04N 1/195 |
| | | | | 345/175 |

(56) References Cited

U.S. PATENT DOCUMENTS

| | | | |
|---|---|---|---|
| 2014/0125671 A1* | 5/2014 | Vorobyov | G06K 9/00637 345/427 |
| 2014/0210802 A1* | 7/2014 | Myers | G09G 5/06 345/207 |
| 2014/0240477 A1* | 8/2014 | Feng | G06T 5/008 348/77 |
| 2014/0320488 A1* | 10/2014 | Ege | G06T 17/05 345/420 |
| 2014/0368507 A1* | 12/2014 | Altman | G06T 17/05 345/426 |
| 2015/0054846 A1* | 2/2015 | Okada | G06F 1/1684 345/589 |
| 2015/0125047 A1* | 5/2015 | Ikenoue | G06K 9/00288 382/118 |
| 2015/0199455 A1* | 7/2015 | Loss | G06T 17/05 703/1 |
| 2015/0254889 A1* | 9/2015 | Bakalash | G06F 9/5061 345/426 |
| 2015/0324989 A1* | 11/2015 | Smith | G06T 7/33 382/278 |
| 2015/0348314 A1* | 12/2015 | Koguchi | G06T 15/506 345/420 |
| 2015/0371440 A1* | 12/2015 | Pirchheim | G06T 7/73 345/419 |
| 2016/0019321 A1* | 1/2016 | Zahner | G06F 30/13 703/1 |
| 2016/0062956 A1* | 3/2016 | Gotman | G06F 40/106 715/243 |
| 2016/0127630 A1* | 5/2016 | Kitajima | H04N 5/2351 348/370 |
| 2016/0189408 A1* | 6/2016 | Chen | G06T 5/005 345/629 |
| 2016/0210087 A1* | 7/2016 | Amir | G06F 3/124 |
| 2016/0352976 A1* | 12/2016 | Kuroiwa | H04N 1/00039 |
| 2017/0148161 A1* | 5/2017 | Griffin | A61B 5/0066 |
| 2018/0253908 A1* | 9/2018 | McClendon | G06T 15/04 |

* cited by examiner

FIG. 6

SYSTEM FOR VISUALIZATION OF A BUILDING MATERIAL

CROSS-REFERENCE TO RELATED APPLICATION(S)

This application is a continuation of and claims priority to U.S. patent application Ser. No. 15/167,240, entitled "System for Visualization of a Building Material", by Rachel Z. Pytel, Gregory F. Jacobs, Robert L. Jenkins, Alex C. Nash, Anthony Jouanin, Brice Dubost, Simon Mazoyer, and Minas R. Apelian, filed May 27, 2016, which claims priority under 35 U.S.C. § 119(e) to U.S. Patent Application No. 62/167,704 entitled "System for Visualization of a Building Material," by Rachel Z. Pytel, Gregory F. Jacobs, Robert L. Jenkins, Alex C. Nash, Anthony Jouanin, Brice Dubost, Simon Mazoyer, Minas R. Apelian and Conor P. McDonald, filed May 28, 2015, and this application claims priority under 35 U.S.C. § 119(e) to U.S. Patent Application No. 62/211,342 entitled "System for Visualization of a Building Material," by Rachel Z. Pytel, Gregory F. Jacobs, Robert L. Jenkins, Alex C. Nash, Anthony Jouanin, Brice Dubost, Simon Mazoyer and Minas R. Apelian, filed Aug. 28, 2015 of which are both assigned to the current assignee hereof and incorporated herein by reference in their entirety.

FIELD OF THE DISCLOSURE

The present disclosure relates to a system for visualization of a building material.

RELATED ART

The design and prototyping of building materials typically requires a significant upfront expenditure of cost and time. Large amounts of money can go into the iterative process. In large part, the costs are driven by the large degree of trial and error involved in creating a desired building material. That is, designers must often undergo a long lead time before it is clear whether the conceived design is suitable.

Currently, consumers looking to design their own, custom products may generate an initial design, however it is not until prototyping that the product may accurately be reviewed to determine desirability. Moreover, prototyping typically utilizes a different manufacturing process than used during fabrication of the final product. Thus, consumers may not be able to accurately visualize the characteristics and qualities of the design (e.g., texture, surface roughness, color) until the final product is manufactured.

The industry continues to demand a system which may permit accurate viewing of a building material without the expensive process associated with manufacture.

BRIEF DESCRIPTION OF THE DRAWINGS

Embodiments are illustrated by way of example and are not intended to be limited in the accompanying figures.

FIG. 6 includes an illustration of a database in accordance with an embodiment and parameters associated with a contemplated building material.

Figure 1:
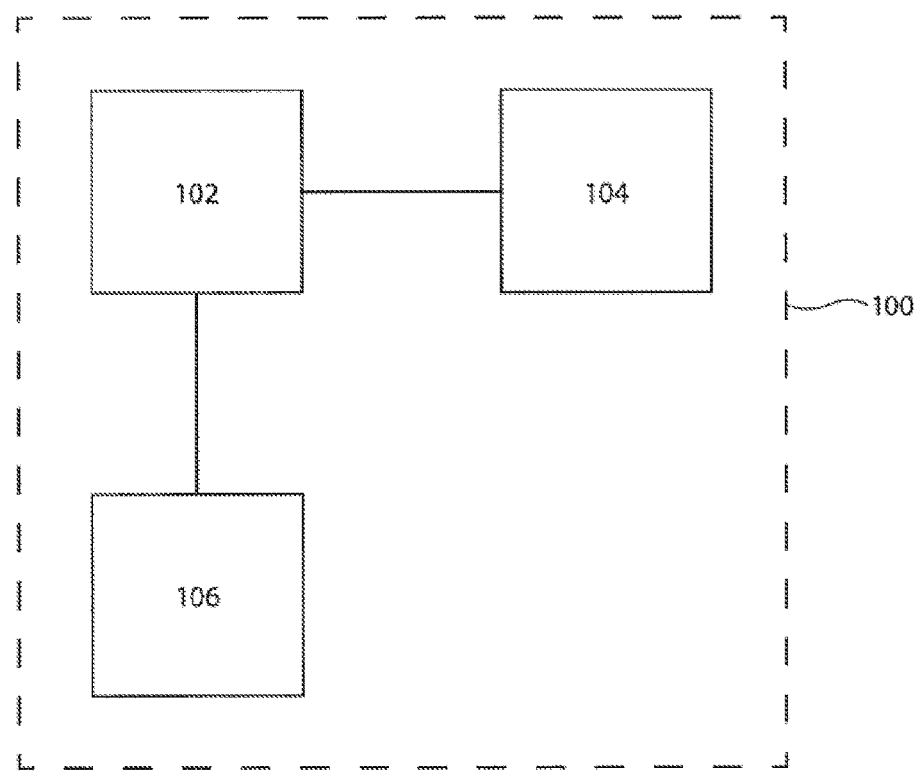
FIG. 1 includes a diagram of a system in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. When a listing of individual members of a group is used herein, all individual members of the group and all combinations and subcombinations possible of the group are intended to be individually included in the disclosure. To the extent not described herein, many details regarding specific materials and processing acts are conventional and may be found in textbooks and other sources within the digital visualization arts.

According to one or more embodiments described herein, a system for rendering a building material can generally include a database having an adjustable parameter relating to a characteristic of a contemplated building material. The system may be adapted to provide a rendered image of the contemplated building material where the rendering has a ΔE, as measured according to a Color Test (described below) with respect to the contemplated building material having parameters associated with the adjustable parameters, of less than 10. In an embodiment, the ΔE may be less than 8, less than 6, less than 5, less than 4, less than 3, less than 2, or less than 1.

According to one or more embodiments described herein, a system for rendering a building material can generally include a database having an adjustable parameter relating to a characteristic of a contemplated building material. The system may be adapted to provide a rendered image of the contemplated building material where the rendering has a shadow accuracy, as measured according to a Shadowing Test (described below) with respect to the contemplated building material having parameters associated with the adjustable parameters, of at least 75%. In an embodiment, the shadow accuracy may be at least 80%, at least 90%, or even at least 95%.

According to one or more embodiments described herein, a system for rendering a building material can generally include a database having an adjustable parameter relating to a characteristic of a contemplated building material. The system may be adapted to provide a rendered image of the contemplated building material where the rendering has a ΔE, as measured according to a Color Test (described below) with respect to the contemplated building material having parameters associated with the adjustable parameters, of less than 10. In an embodiment, the ΔE may be less than 8, less than 6, less than 5, less than 4, less than 3, less than 2, or less than 1.

According to one or more embodiments described herein, a system for rendering a building material can generally include a database having an adjustable parameter relating to a characteristic of a contemplated building material. The system may be adapted to provide a rendered image of the contemplated building material where the rendering has a shadow accuracy, as measured according to a Shadowing Test (described below) with respect to the contemplated building material having parameters associated with the adjustable parameters, of at least 75%. In an embodiment, the shadow accuracy may be at least 80%, at least 90%, or even at least 95%.

As illustrated in FIG. 1, a system 100 for visualizing a building material can generally include a logic element 102 operatively coupled to a user interface 104. As used herein, a "building material" refers to a material which may become part of a structure. Exemplary building materials include roofing, siding, fencing, railing, decking, flooring, ceiling material, wall material, and other similar materials. The building material may be an interior material, such as wall covering, ceiling treatments, blinds, molding, or shelving, disposed within the building. The building material may also be exterior material, such as stucco, siding, or decking disposed on the outside, or at least partially along the outside, of the building. As used herein, a "building" refers to both permanent and temporary structures, including single story buildings, multiple story buildings, apartments, offices, detached structures (e.g., detached garages, sheds, carports, arbors), mobile buildings, fencing, decking, railing, or any other similar structure which may permanently or temporarily occupy an area of land. As used herein, "operatively coupled" refers to a configuration of elements such as device components, wherein an action or reaction of one element may affect another element, but in a manner that preserves each element's functionality. For example, operatively coupled components may be in contact, such as in electrical contact by a signal-conductive wire or a wireless communication protocol such that a signal is output from a first component and wirelessly received by a second component. Operatively coupled components may be coupled directly together, i.e., a signal generated by a first component transmits directly to the second component, or by one or more intervening components, such as relays, wireless communication devices, or other suitable, intervening components.

In one embodiment, the logic element 102 can have access to one or more calibrated photographs of the building onto which the building material is to be rendered for review. A "photograph" as used herein generally includes an image of a real object photographed by a digital photographic apparatus, that is, photographs or moving pictures. A "photograph" can further include an image of the real object as photographed by a film camera, for example on photographic film, and transferred to a digitally accessible format. A "photograph" may also include an accurate rendering of the real object in a digitally accessible format. A "calibrated photograph" as used herein refers to a photograph calibrated with standard targets of accuracy, such as for example, standard color targets (e.g., X-rite Color Checker). For instance, when photographing a uniform lambertian reflector having uniform light distribution with a homogenous luminance, the resulting calibrated photograph (either taken directly or after being subjected to computational correction) has a lightness value of each pixel within a range of no greater than ±10% as compared to a mean lightness value of the overall photograph. In a further embodiment, each pixel can have a lightness value within a range of no greater than ±9%, ±8%, ±7%, ±6%, ±5%, ±4%, ±3%, ±2%, or ±1%. In certain embodiments, the photograph can have a calibrated color value for each pixel within a range of no greater than 10 ΔE as compared to the color of the reference object (measured with a calibrated colorimeter), the reference object having a color within the gamut of the sRGB color space. In a further embodiment, each pixel can have a color value within a range of no greater than 9 ΔE, 8 ΔE, 7 ΔE, 6 ΔE, 5 ΔE, 4 ΔE, 3 ΔE, 2 ΔE, or 1 ΔE as compared to the color value of the reference object. Use of a calibrated photograph may be particularly important in embodiments where the building material is rendered over a large area of the photograph (e.g., the building material occupies at least 50% of the photograph) as deviations from calibration, such as deviations which may occur around the edges of uncalibrated photographs, may skew, or alter, the rendered image. Calibration of the photograph can occur, for example, by the digital photographic apparatus at or around the time of capturing the photograph, or at a later time by computational software (e.g., post-processing).

In a particular instance, the raw photograph taken by the digital photographic apparatus can be subjected to one or more post-processing steps after capture. Traditional photographic apparatuses often produce less-than faithful images of the scene being captured. Unprocessed images can appear soft, dull, or unsaturated to the viewer. Post-processing can correct the raw, captured image to have a high fidelity to the captured scene.

The one or more post-processing steps can occur, for example, on a logic element, such as a computer. Exemplary post-processing operations include adjustment of at least one of exposure, white balance, sharpness, noise, contrast, or any other readily known post-processing operation. The final, post-processed image can be referred to as a "post-processed, calibrated photograph."

In an embodiment, each photograph can include metadata, such as positional information (e.g., geotagging, positional arrangement) or directional information (e.g., angular position with respect to the sun, azimuth and viewing angles), which can be included, for example, as an exchangeable image file format (EXIF) and may be stored in an image or an independent file type. In a particular embodiment, the metadata may include geographic coordinate system identification, such as latitude or longitude of the location where the photograph was taken. In a further embodiment, the metadata may specify the date or time of day the photograph was taken. The system 100 may utilize the geographic coordinate system identification and date to retrieve average or actual conditions at the time the photograph was captured at the location of capture. That is, the system 100 may simulate the conditions at the location at the time the photograph was captured. "Average" conditions refer to average environmental and luminance conditions at the latitude and longitude of the photograph, for the given date and time of capture. "Actual" conditions may be taken from historical records and may reflect the actual environmental and luminance conditions at the location and time the photograph was captured.

In an embodiment, photographs of the building may be any one of perspective, elevation, isometric, or orthogonal views. In another embodiment, at least one of the photographs may be of a non-traditional view of the building, such as an angular view from a non predefined location and angle. In a particular embodiment, the logic element 102 may receive a description of the view presented in the photograph (i.e., is the photograph a perspective view or a non-traditional view). Entrance of the description or similar directional information may facilitate or enhance rendering quality by better permitting proper alignment and orientation of the building material with respect to the building.

Figure 2:
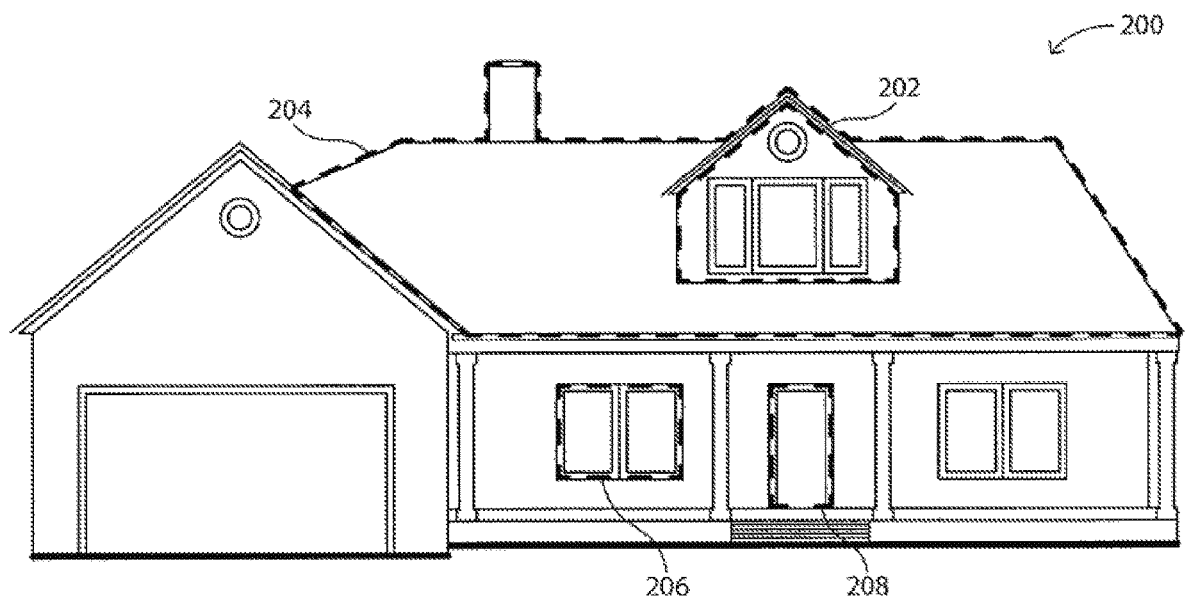
FIG. 2 includes an illustration of an embodiment of a photograph with masking.

FIG. 2 includes an exemplary photograph of a building as might be accessed by the logic element 102. In certain embodiments, the photograph may include digital masking defining discrete surfaces and features within the photograph. For example, digital masking may divide a house 200 into wall surfaces 202, roof surfaces 204, window surfaces 206, door surfaces 208, or any other recognizable surface. The wall surfaces 202, for example, may further be categorized by relative location along the house, e.g., first story, second story, or third story. The digital masking may allow for discrete selection of one surface, or even one relative location, of the house 200 to permit selective augmentation or adjustment of that surface, independent of the other remaining surfaces. In one particular instance, the digital masking may be visible to a user, such as for example, by inclusion of outlines around each masked surface. In another instance, digital masking may be hidden, whereby a user cannot actively see demarcation or delineation of the different surfaces. In certain embodiments, digital masking can be automatically generated, for example, by a computational device such as a computer. Automatic digital masking ca define the surfaces using a formula or other logic operating analysis. In other embodiments, digital masking may be human generated. That is, a human may select or outline one or more surfaces for masking. In an embodiment, human generated masking may involve computational logic. For example, a human can manually select a particular surface of the building whereupon the computational logic automatically outlines the surface. In another example, a human can geometrically select an area or a portion of an area that delineates a surface comprising a particular building material. In other embodiments, digital masking may be human generated. That is, a human may select or outline one or more surfaces for masking. In an embodiment, human generated masking may involve computational logic. For example, a human can manually select a particular surface of the building whereupon the computational logic automatically outlines the surface. In another example, a human can geometrically select an area or a portion of an area that delineates a surface comprising a particular building material. In an embodiment, the digital masking may be user adjustable. That is, the user may select the masking and manually adjust one or more portions thereof. For example, a user may distinguish a wall surface 202 into multiple wall surfaces, thereby allowing the wall surface to include, for example, multiple building materials therealong. Alternatively, the user may correct for any problems or misalignment of the digital masking with respect to the house 200.

In an embodiment, digital masking can include automatic detection of surfaces of the image to be masked. Exemplary masking techniques can rely on texture classification techniques, color segmentation, or a combination thereof. Perspective detection can detect relative angles of objects in the image. For example, the pitch of a roof, the angle of a house wall, and other similar surface angles can be detected, thereby permitting refined masking and overlay. Perspective detection can include canny edges and Hough transform and perspective retrieval like exterior orientation using coplanar parallel lines. Information related to the perspective of the objects in the image can be processed to determine the relative angle and orientation of elements being masked in the image. In turn, the rendering can be done such that the elements rendered onto surfaces are rendered at the correct angles, orientations, sizes, or any combination thereof.

Referring again to FIG. 1, in an embodiment, the logic element 102 and user interface 104 may be connected together by one or more non-wireless communication systems. For example, the logic element 102 and user interface 104 may be connected together by a LAN network, or directly connected together through physical wiring. In another embodiment, the logic element 102 may be connected to the user interface 104 by one or more wireless communication systems as one or more data streams over a network or other wireless signal. For example, in a particular embodiment, a satellite communication element can relay a signal between the logic element 102 and the user interface 104. Transfer formats and protocols are generally known in the art, and may additionally include web services over HTTP or HTTPS protocols.

In a particular instance, the logic element 102 and user interface 104 may be distributed across multiple computer systems, such as where the logic element 102 is stored in a server cluster and the user interface 104 is part of a mobile device, such as a tablet, computer, or mobile telephone. In another instance, the logic element 102 and user interface 104 may be part of, or generally in, a single machine such as a desktop computer, workstation, mainframe, server, laptop computer, or other similar computer system. For example, the logic element 102 and user interface 104 may both be integrated in a personal computer where the logic element 102 includes one or more central processing units (CPU), such as microprocessors or microcontrollers, and the user interface 104 is an electronic visual display, such as for example, a liquid crystal display (LCD), a light-emitting diode (LED) display, organic light-emitting diode (OLED) display, a plasma display, a CRT display, or another type of display or visual monitor.

In an embodiment, the system 100 can further include a storage element 106 such as a magnetic data storage system, an optical system, a FLASH system, or any suitable data storage system. The storage element 106 may be in communication with the logic element 102, for example, via any one of the protocols discussed above. In a particular instance, the storage element 106 and logic element 102 may be distributed across multiple computer systems and can communicate through a wired or wireless protocol. In another instance, the storage element 106 and logic element 102 may be part of, or generally in, a single machine. The storage element 106 may store one or more photographs, such as calibrated photographs, which may be accessible by the logic element 102 during system operation. As discussed in greater detail below, during system operations, the logic element 102 may access one or more of the photographs, or calibrated photographs, stored in the storage element 106 in order to render a building material thereon.

The process of visualizing a contemplated building material in accordance with embodiments described herein can generally include entering or adjusting an adjustable parameter and rendering an image of the contemplated building material having the attribute(s) associated with the adjustable parameter. As used herein, a "contemplated building material" refers to a building material contemplated by a user. In a particular embodiment, the contemplated building material may not yet be commercially available for sale. In a particular instance, the contemplated building material may include an already known building material with a different attribute. That is, a user may want to modify a commercially available building material to have one or more different attributes than the commercially available version.

Figure 3:
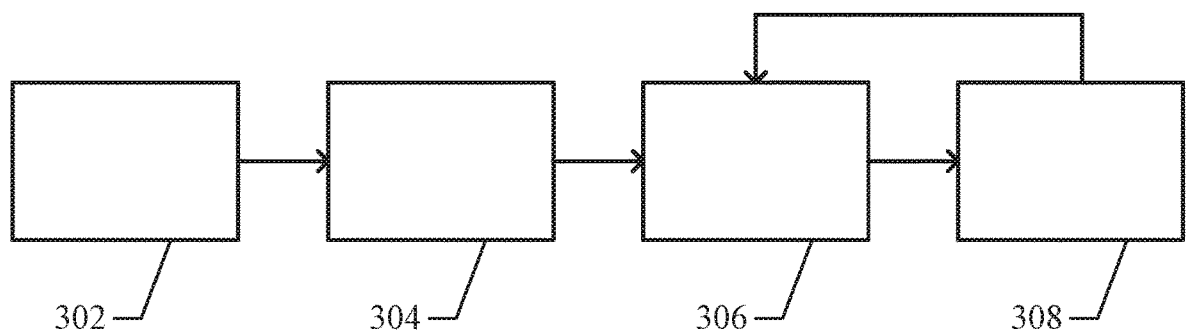
FIG. 3 includes a flowchart of an embodiment of a process for rendering a contemplated building material.

FIG. 3 includes a flowchart of an embodiment of a process 300 for visualizing the contemplated building material. The process 300 may begin when a user selects 302 a type of building material to be visualized. As described above, exemplary building materials include roofing, siding, fencing, railing, decking, flooring, ceiling material, wall material, blinds, molding, shelving, stucco, mortars, renders, siding, glass panels, decking, masonry, and synthetic or simulated masonry.

In a particular instance, selection 302 of the type of building material may be performed using a selectable grouping where a user may pick from a list of possible building materials. "List" refers to a grouping of at least 2 options, at least 3 options, at least 4 options, at least 5 options, at least 10 options, at least 20 options, at least 30 options, at least 40 options, at least 50 options, at least 60 options, at least 70 options, at least 80 options, at least 90 options, at least 100 options. The available building materials in the list may be categorized, such as for example, into types of materials (wood, stucco, vinyl, etc.) and further sub-categorized (e.g., dark wood or light wood, stained wood or painted wood, coarse wood or finely-finished wood) for user convenience. In an embodiment, the user may further review the available building materials via representative images whereby the user can see a small photograph or rendering of each of the building materials as viewed in a non-accurately rendered state.

In an embodiment, the selection 302 may include entrance of a new type of building material not available in the selectable grouping. The user may manually spell a name of the new building material into a box for typing text. For example, the user may type, "GUARDRAIL" or "GUTTER GUARD" or "BASEMENT SIDING". In a particular embodiment, the system may ask for qualities describing the new building material, such as for example, dimensional sizes, surface curvatures.

After selecting 302 the type of building material, a user may enter 304 into a database an adjustable parameter relating to a characteristic of the contemplated building material. In an embodiment, the user may digitally enter at least one of a numeric or alphabetic characteristic relating to an attribute of the contemplated building material in one or more selectable or text-prompted locations. In another embodiment, the user may enter the adjustable parameter through adjusting a physical interface such as a toggle, a sliding indicator, a rotatable knob, or any other suitable parameter adjustment component. In a particular embodiment, the physical interface may be displayed on the interface. In another embodiment, the toggle, sliding indicator, rotatable knob, or the like may be a physical component which the user may grasp (i.e., the physical interface may be a physical component disposed, for example, on a work surface). In yet a further embodiment, the user may enter the adjustable parameter through a combination of digital and physical interfaces.

In an embodiment, the adjustable parameters may include at least 1 adjustable parameter, at least 5 adjustable parameters, at least 10 adjustable parameters, at least 25 adjustable parameters, at least 50 adjustable parameters, at least 75 adjustable parameters, or even at least 100 adjustable parameters.

In a particular embodiment, the adjustable parameters may include a physical attribute of the contemplated building material, such as for example: a solar reflectance parameter; a near infrared reflectance parameter; a material planarity measurement describing the area of the building material having a planar surface per unit area; macroscopic surface roughness patterning; average surface roughness; relative color within a predefined, controlled environmental setting such as a laboratory setting; a reflection spectra; a chroma; a hue; a luminance; a gloss; a contrast; a material type; a color probability defining the probable color for each granule type of material at every possible location along the building material; a material height or depth (e.g., the height of a shingle at every location); a granules spatial arrangement and light trapping characteristic; a light scattering property (e.g., parameters of a GGX model), any other suitable material parameter of the building material; or any combination thereof.

The solar reflectance parameter may describe the quantity of solar reflectance of the building material as measured in accordance with ASTM C-1549 procedure or by a solar spectrum reflectometer. Near infrared reflectance (NIR) parameter may refer to the reflectance of the near infrared range (700 nm to 2500 nm) of the solar spectrum.

In particular instances, planarity can be measured along small areas. For example, planarity may be measured on a scale between 0.0001 m$^2$ and 0.1 m$^2$ for one or more substantially planar zones. In another embodiment, planarity may be measured on a scale of about 0.2 m$^2$, about 0.5 m$^2$, about 1 m$^2$, about 1.7 m$^2$, or about 2 m$^2$ for one or more substantially planar zones. In an embodiment, the building material on the building can include one or more substantially planar zones, at least one of the zones being substantially planar on a scale of about 0.2 m$^2$, about 0.5 m$^2$, about 1 m$^2$, about 1.7 m$^2$, or about 2 m$^2$. As used herein, "substantially planar" refers to a two-dimensional characteristic of a surface extending generally along a plane. The term does not limit the zone to being smooth, as the surface may be textured if desired. Textures can vary in scale. For example, the granule surface of a roofing shingle may have a texture; the granules on the surface of the shingle may have a texture; and the structure of multiple layers may have a texture, all of which are different from one another. Planar, or substantially planar, zones of building material may be reflected by area of material in the X- and Y-directions. Planarity may include slight deviations into a Z-direction, perpendicular to the X- and Y-directions. That is, a substantially planar zone may have minimal surface undulation reflected by a portion of that zone extending into the Z-direction. In an embodiment, a zone may be substantially planar when it extends into the Z-direction by 1 inch, 2 inches, or 3 inches. In another embodiment, a zone of the building material may be non-planar when it extends more than 3 inches in the Z-direction. In a particular instance, Z-direction deviation, resulting, for example, from surface undulation may constitute non-planarity when the deviation extends more than 3 inches in the Z-direction.

In particular embodiments, the building material can have a non-white color in the visible spectrum (390 nm to 700 nm). Building materials having a color falling within an inverted conical volume defined by the equation:

$$-(L^*)+[((L_O^*)+(y(a^*)^2+z(b^{*\circ})^{0.5}))]/x \leq 0$$

where $L_O^*=67$, $x=1.05$, $y=1.0$, $z=1.0$, and the values, $L^*$, $a^*$, and $b^*$ are defined on the CIE $L^*a^*b^*$ scale are said to be white and building materials falling outside the inverted conical volume are said to be non-white. Values of the color space corresponding to white within the inverted conical volume close to the vertical $L^*$ axis are not strongly colored and have a relatively high degree of lightness. The white or non-white characteristic of the building material may be quantified and stored in the database 600. The above described parameters are meant to be exemplary and may further include other properties of the building material—especially those properties which manifest through visual observation.

Certain parameters of the contemplated building material may be mutually exclusive and may not be compatible with each other. Optionally, the system may include an indication when certain adjustable parameters are mutually exclusive and cannot be combined into a single building material. For example, certain materials having a high surface gloss finish may not also be capable of having low near infrared reflectance (NIR). In the instance where a user attempts to generate a material having both high surface gloss finish and low NIR, the system may generate a warning—such as a textual warning, an auditory warning, or another suitable visual warning—that the contemplated building material is not feasible. Alternatively, the system may automatically hide (make unavailable or prevent selection of) mutually exclusive parameters. For example, upon selection of a high surface gloss finish, the NIR parameter may automatically adjust such that a user cannot select low NIR. In another example, a material may have a high surface gloss finish and a low NIR. In such instance, the system may permit a user to generate a material having a high surface gloss finish and a low NIR.

In a particular embodiment, parameters of the new, contemplated building material may be stored in a database, permitting future users access to the new, contemplated building material. Additionally, the user interface may include a section, such as for example, a "Recently Created" section, where users may see designs, patterns, and alternate building materials recently generated by other users. Future users may select one or more of the new, custom designed building materials for further modification.

In an embodiment, the adjustable parameter may include a manufacturing process for formation of the building material. That is, the adjustable parameter may define a method of making the contemplated building material. Exemplary manufacturing processes include, but are not limited to, material blending of colored granules, shaping cut lines and surfaces (e.g., shape of shingle cut), three-dimensional shapes of molds or embossing wheels, textures of transfer rolls, paint types, or delineation of a specific formation process (e.g., stamping, pressing, rolling, extruding, etc.). Such manufacturing processes may affect the appearance of the contemplated building material, particularly as observed over changing environmental conditions (e.g., changing time of day). For example, a roofing material cut by laser etching may have a different edge characteristic than a similar roofing material cut by a saw.

In an embodiment, each adjustable parameter can include several (e.g., 10, 100, 1,000, or even 10,000) adjustable sub-parameters. For example, one of the adjustable parameters may define a component of the surface metrology of the contemplated building material, such as surface roughness. Adjustable sub-parameters relating to surface roughness might include, for example, average surface roughness, $R_a$, root mean squared, $R_{RMS}$, maximum valley depth, $R_v$, maximum peak height, $R_p$, skewness, $R_{sk}$, kurtosis, $R_{ku}$, or the RMS slope of the surface within the sampling length, $R_{dq}$. In this case, the user may enter values for any one or more of the above sub-parameters relating to surface roughness.

In certain instances, the user may only want to enter some of the adjustable parameters associated with the contemplated building material. That is, the user may describe certain attributes relating to the contemplated building material without necessarily entering a value for each of the available adjustable parameters. In such instances, it may be desirable to have a default value for those non-entered adjustable parameters.

In an embodiment, the default may include a neutral value. As used herein, a "neutral value" refers to a starting threshold from which visual parameters of the rendered image may be altered. For example, the gloss of the contemplated building material may be between, such as exactly between, a full gloss and a matte finish. The "neutral value" may be selected such that a user can adjust the adjustable parameter either in an increasing or decreasing direction to visualize the contemplated building material either more or less of that parameter, respectively. In a more particular embodiment, the neutral value assigned to the attribute may be exactly between the selectable limits, such that the parameter can be increased and decreased by a same amount.

After the user enters 304 the adjustable parameter into the database, the user may cause the system to render 306 an image of the contemplated building material for visual inspection. In an embodiment, the user may further select an image or rendering of a building onto which the contemplated building material can be applied for visual inspection. In a more particular embodiment, the user may be able to move the contemplated building material relative to the building. For example, the user may three-dimensionally rotate or translate the contemplated building material with respect to the building. As described above, the user may select a masked surface onto which the contemplated building material is to be rendered for inspection.

The rendered image may have be a high-accuracy visual approximation categorized into at least two components: color accuracy ($\Delta E$) and shadow accuracy.

Color accuracy, $\Delta E$, can be measured according to a Color Test which compares the color of the rendered image to the color of the contemplated building material as it would appear if it were to be manufactured and positioned in the same conditions in a real environment over an area, such as, for example, 1 cm². The Color Test utilizes the Commission Internationale de l'Eclairage CIEΔE2000 (L* a* b*) standard defined using the terms of the CIE 1976 definition, comparing rendered color to real color. ΔE represents the change in color, or color difference, between the rendered image and a calibrated photograph. When compared to the calibrated photograph of the real building material, the rendered image can have a ΔE of less than 10, less than 9, less than 8, less than 7, less than 6, less than 5, less than 4, less than 3, less than 2, or less than 1.

In an embodiment, a second color accuracy, $\Delta E_2$, can be measured according to a second Color Test which compares the color of the rendered image to the color of the real material as illustrated in the same conditions in a post-processed, calibrated photograph over an area, such as, for example, 1 cm². Similar to the Color Test, the second Color Test can utilize the Commission Internationale de l'Eclairage CIEΔE2000 (L* a* b*) standard defined using the terms of the CIE 1976 definition, comparing rendered color to real color. $\Delta E_2$ represents the change in color, or color difference, between the rendered image and the post-processed, calibrated photograph. When compared to the post-processed, calibrated photograph of the real building material, the rendered image can have a $\Delta E_2$ of less than 10, less than 9, less than 8, less than 7, less than 6, less than 5, less than 4, less than 3, less than 2, or less than 1.

Shadow accuracy can be measured according to the Shadow Test which compares shadow fidelity of the rendered image to the shadowing of the contemplated building material as it would appear if it were to be manufactured and positioned in the same conditions in a real environment. Shadows might be formed, for example, by shingle tabs or siding shakes and the relative angle of illumination (e.g., the position of the sun in the sky). The shadows are measured for accuracy of size and luminance over changing illumination conditions, material orientation, and relative viewing angle. When compared to the contemplated building material having parameters associated with the adjustable parameters, the rendered image can have a shadow accuracy of at least 75%, at least 80%, at least 90%, or even at least 95%. That is, at least 75%, 80%, 90%, or 95% of the shadow size and layout may be accurate to the shadows of the contemplated building material if the contemplated building material were to be manufactured and positioned in the same conditions in a real environment.

In an embodiment, color and shadow accuracy can be measured after completion of the rendering at various sample positions along the rendered image, i.e., at various areas of 1 cm². In a particular aspect, $\Delta E_{AVG}$ is indicative of an average ΔE as measured at the various sample positions. That is, $\Delta E_{AVG}$ is a measure of average color accuracy according to the Color Test. For example, a first sample position may have a ΔE of approximately 1, a second sample position may have a ΔE of approximately 0.7, and a third sample position may have a ΔE of approximately 0.1. The $\Delta E_{AVG}$ would thus be the sum of the individual ΔE measurements divided by the number of measurements taken, which in this example is 0.6. The same average can be calculated for shadow accuracy or second color accuracy. That is, average shadow accuracy may include an average of multiple shadow accuracy calculations or multiple second color accuracy calculations taken at various sample positions.

In another embodiment, at least one of color accuracy, second color accuracy, and shadow accuracy can be determined by comparing point ensembles between the calibrated photograph or post-processed, calibrated photograph and the rendered image. That is, rather than measure color accuracy, second color accuracy, or shadow accuracy using various sample positions having areas less than the area of the image, it is possible to test ΔE, $\Delta E_2$, or shadow accuracy using one or more clustering techniques, such as those derived from signal processing. By way of a non-limiting example, point ensemble analysis can include the use of k-means, EM clustering, spectral clustering, or any combination thereof to compare the color or shadow point ensemble of the calibrated photograph or post-processed, calibrated photograph to the rendered image.

K-means clustering is a method of partitioning data with numerical vectors, where each numerical vector has dimensionality, M, and there are N such vectors. The value, K, refers to an input parameter that determines the number of partitions to be produced. In general, K-means clustering attempts to find an optimum way to cluster the data into K partitions so as to minimize the average difference between the mean of each cluster (i.e., cluster centroid) and every member of the cluster.

EM clustering, or use of the Expectation-Maximization algorithm, is based on distance computations. EM clustering alternates between an expectation (E) step and a maximization (M) step. The expectation step determines the expectation of a log-likelihood using current estimates for the parameter. Maximization computes parameters maximizing the expected log-likelihood determined during the expectation step. The estimates are then able to determine the distribution of the latent variables in the next expectation set until a clustered model is realized.

Spectral clustering is derived from the use of eigenvalues to perform dimensionality reduction. The primary tool for spectral clustering are graph Laplacian matrices. In a particular instance, spectral clustering can be performed using image segmentation such as the normalized cuts algorithm. Spectral clustering may have several advantages over traditional clustering and algorithmic techniques such as higher performance and simpler calculation protocol.

In an embodiment, the calibrated photograph or post-processed, calibrated photograph can be processed using one or more of the point ensemble methods described above. The rendered image can undergo a similar or same point ensemble method. The resulting cluster distributions can be compared to determine any one of the ΔE, $\Delta E_2$, and shadow accuracy of the rendered image with respect to the calibrated photograph or post-processed, calibrated photograph.

High shadow and color accuracy are important to accurately simulate real building materials. While traditional systems for visualizing a building material may appear to generate a realistic simulation, such renderings are artistically based and not objectively rendered. That is, the rendered components do not correspond to actual materials, but rather arbitrary materials devised using non realistic parameters and metrics and adapted to appear real. Accordingly, the rendered images provided by the prior art may not be "life-like" under changing environmental conditions despite the appearance of such visual accuracy.

Rendered images generated by the process 300 may further have relative accuracy with respect to each other. For example, two or more rendered images may have a relative color accuracy, dE, with respect to each other where dE, upon changing illumination conditions, material orientation, or viewing angle, is less than 5, less than 4, less than 3, less than 2, or less than 1 as calculated according to CIEΔE2000 tolerancing. That is, dE defines the difference between ΔE of two rendered images. By way of a non-limiting example, if a first rendered image has a ΔE of 2.7 and a second rendered image has a ΔE of 1.4, the dE of the two images is the difference between 2.7 and 1.4, or 1.3. In another example, if a first rendered image has a ΔE of 4.1 and a second rendered image has a ΔE of 2.9, the dE of the two images is the difference between 4.1 and 2.9, or 1.3. It is noted that the minimum perceptible change to an average human eye is approximately a ΔE of about 1.0. The two or more rendered images need not be compared at the same environmental conditions (i.e., the same luminance intensity, lamination angle, etc.). Rather, dE is an environmentally independent method of comparing system effectiveness. Whereas a randomly generated rendering (i.e., a rendered image not derived from a real building material) may be accurate to a real building material in a real environmental setting with a frequency of 0.001% (for example), a rendered image in accordance with embodiments described herein can be accurate to real building materials with a frequency of at least 90%, at least 95%, at least 96%, at least 97%, at least 98%, or at least 99%. That is, ΔE is accurate over a wide range of environmental conditions as adjusted by a user in a manner as set forth above.

Relative color accuracy, dE, may further apply for rendered images generated in response to post-processed, calibrated photographs. For example, two or more rendered images may have a second, relative color accuracy, $dE_2$, with respect to each other where $dE_2$, upon changing illumination conditions, material orientation, or viewing angle, is less than 5, less than 4, less than 3, less than 2, or less than 1 as calculated according to CIEΔE2000 tolerancing. That is, $dE_2$ defines the difference between $\Delta E_2$ of two rendered images. By way of a non-limiting example, if a first rendered image has a $\Delta E_2$ of 1.0 and a second rendered image has a $\Delta E_2$ of 0.9, the $dE_2$ of the two images is the difference between 1.0 and 0.9, or 0.1. The two or more rendered images need not be compared at the same environmental conditions (i.e., the same luminance intensity, lamination angle, etc.). Rather, $dE_2$ is an environmentally independent method of comparing system effectiveness. Whereas a randomly generated rendering (i.e., a rendering not derived from a real building material) may be accurate to a real building material in a real environmental setting with a frequency of 0.001% (for example), a rendered image in accordance with embodiments described herein can be accurate to real building materials with a frequency of at least 90%, at least 95%, at least 96%, at least 97%, at least 98%, or at least 99%. That is, $\Delta E_2$ is accurate over a wide range of environmental conditions as adjusted by a user in a manner as set forth above. It is noted that for many instances, $dE_2$ and dE yield the same results when comparing two images as long as the two images are rendered using the same $\Delta E_2$ (i.e., ΔE or $\Delta E_2$).

As illustrated in FIG. 3, after rendering is complete the user may modify 308 one or more of the adjustable parameters associated with the contemplated building material. In an embodiment, the user may return to the database and modify one of the adjustable parameters. The system may then render the contemplated building material having parameters associated with the modified adjustable parameter. In a particular instance, some or all of the non-modified adjustable parameters can retain the value they were given prior to the initial rendering 306. In another instance, it may be desirable to reset the non-modified adjustable parameters to a neutral value. Such decision may be made by the user, for example, by use of a switch, dial, or other suitable selection element of the system. As described above, the first and second rendered images may have a dE with respect to each of less than 5, less than 4, less than 3, less than 2, or less than 1. The user may repeat the modification 308 multiple times (i.e., at least 2 times, at least 3 times, at least 4 times, at least 5 times, at least 10 times, at least 20 times, at least 50 times, at least 100 times).

In an embodiment, the user may adjust environmental conditions of the rendered image to view the contemplated building material in a range of simulated environmental conditions. For example, the user may increase or decrease the lighting intensity to accurately visualize naturally changing daylight conditions such as those conditions encountered at dawn, midday, dusk, or evening. Additionally, the user may adjust one or more light angularity conditions to accurately visualize the building material at different light source angles. For example, the user may accurately visualize the visual properties of the building material on the building when the sun is along the horizon or directly overhead. The user may also select from a variety of a light diffusion settings adjusting for environmental conditions such as haze, cloud coverage, fog, rain, and foliage cover. The user may also select from direct or indirect lighting. In an embodiment, the user may select from a list of predetermined environmental conditions. For example, one or more switches or sliding scales may have preset variables from which a user can select. Exemplary preset environmental variables include "sunny," "raining," "cloudy," "foggy," or "snowing." In a further embodiment, the user can set the conditions to change, e.g., from sunny to cloudy, to visualize the changing conditions on the building material.

The user may also adjust the environmental conditions to simulate weather and the sun's path at different latitudinal and longitudinal positions. In an embodiment, the user may enter a latitude or longitude into the system. The user may enter a time of year (e.g., fall, summer, spring, winter) or an exact date (e.g., June 14) to see the effect of the sun on the material. In a further embodiment, the user may adjust the relative position and angle of the contemplated building material with respect to the latitude and longitude. This may allow the user to more accurately visualize the building material at the desired position and angle of use. In yet another embodiment, the user may also adjust foliage density, position, type, or other properties thereof to further visualize the contemplated building material in a more particular environment.

In certain embodiments, the user may adjust a spectral distribution of illumination from the light source. The user may account for changes, for example, related to different light sources, including natural and non-natural or artificial lighting. Lamps, floodlights, fluorescent lights, daylight bulbs, natural sunlight, and other lighting variables may be adjusted to more accurately generate a rendered image in the spectral illumination in which the building material is viewable. In an embodiment, lighting designers and manufacturers can accurately depict spectral properties of manufactured light sources such that the user can view the building material under a particular type of light provided by a particular supplier. In this case, the user may view the building material as it would appear in the setting it is to be positioned in.

In an embodiment, the rendered image may be converted to a moving picture, or video, such that the user can visualize the contemplated building material over a continuously adjustable angle or condition. In a first example, the moving picture may include a rendered view of the contemplated building material rotating about an axis or azimuthal orientation. In another example, the moving picture may include a rendered view of the contemplated building material as viewed over an elapsed period of time, e.g., 12 hours, thereby allowing a viewer to visualize continuously changing environmental conditions (luminance intensity, angle, etc.). In yet a further example, the moving picture may include a rendered view of the contemplated building material as viewed over an elapsed period of time and rotating about an axis or azimuthal orientation. The moving picture may be convertible to a known format for storage, comparison, or sharing. As systems with low processing or computational power may require significant time to compile moving pictures, it may be desirable for the user to save the moving picture for future viewing, so as to reduce the number of times rendering operations must be completed.

In an embodiment, the rendered image, or moving picture, may be viewed through 3-dimensional glasses, such as those offered by Oculus or Microsoft under the name HoloLens, or a system permitting 3-dimensional observation of the contemplated building material, such as a 3-dimensional screen system, a holographic system, or a combination thereof. In a particular embodiment, the memorialized rendered image may be viewed via a holographic projector.

In a particular embodiment, the system may generate audible frequencies which can pertain to the contemplated building material, thereby permitting the user to discern, for example, the acoustic absorption, sound damping, and reflective properties of the contemplated building material. In an embodiment, the user may select from varying intensity environmental conditions (e.g., wind) and observe the acoustic fingerprint of the contemplated building material under that condition. Certain materials may better absorb certain frequencies as compared to other materials.

In an embodiment, the system may further generate a cost estimate for the user. That is, the system may provide an ongoing cost estimate given the type and amount of specific material being applied to the contemplated building material.

Figure 4:
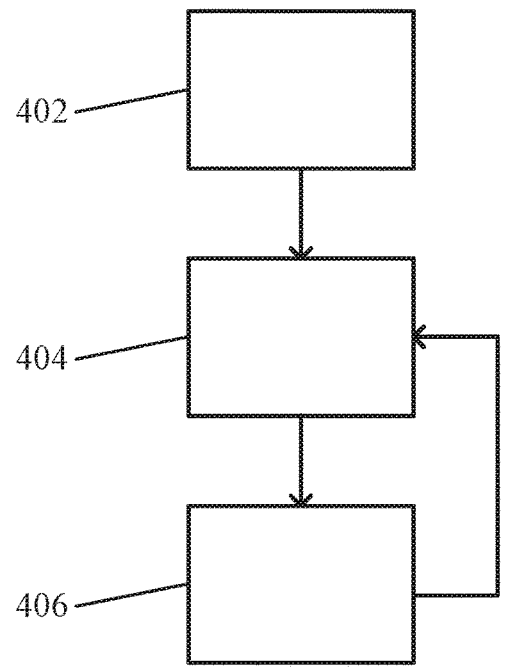
FIG. 4 includes a flowchart of another embodiment of a process for rendering a contemplated building material.

FIG. 4 includes a flowchart of an embodiment of another process 400 for visualizing the contemplated building material. The process 400 may begin when a user selects 402 a type of building material to be visualized. As described above, exemplary building materials include roofing, siding, fencing, railing, decking, flooring, ceiling material, wall material, blinds, masonry, molding, shelving, stucco, siding, and decking. Selection 402 of the type of building material may involve any number of similar steps or features as described above with respect to selection 302. For example, the selection 402 may include entrance of a new type of building material not available in the selectable grouping. Different than selection 302, selection 402 of the type of building material to be visualized provides the user with initial starting values entered for each adjustable parameter that may be associated with an already existing building material. That is, selection 402 of the type of building material starts the process 400 with an already known building material and the associated parameters thereof.

The user may then modify 404 one or more of the adjustable parameters associated with the contemplated building material. In an embodiment, the user may render the already existing building material prior to modifying 404 one or more of the adjustable parameters. This may allow the user to visually inspect the already existing building material before modifications are made thereto.

Modification 404 may involve any number of similar steps or features as discussed above with respect to modification 308. For example, in an embodiment, the user may adjust surface roughness of a portion, or all, of the building material. The system can then render 406 the contemplated building material using the modified adjustable parameters. Rendering 406 may include any number of similar features or attributes as discussed above with respect to rendering 306. After viewing the rendered image, the user may then further modify 404 the adjustable parameters and render a modified rendering of the contemplated building material having the modified adjustable parameters.

In an embodiment, systems and processes described herein may be used to design new building materials. The new building materials may be based on existing building materials as described, for example, in process 400 whereby at least some of the adjustable parameters have initial starting values or designed from scratch, for example, using process 300. By utilizing one of processes 300 or 400, the user may greatly reduce costs associated with traditional prototyping and iterative design while affording the same, if not greater, degree of design freedom.

Figure 5:
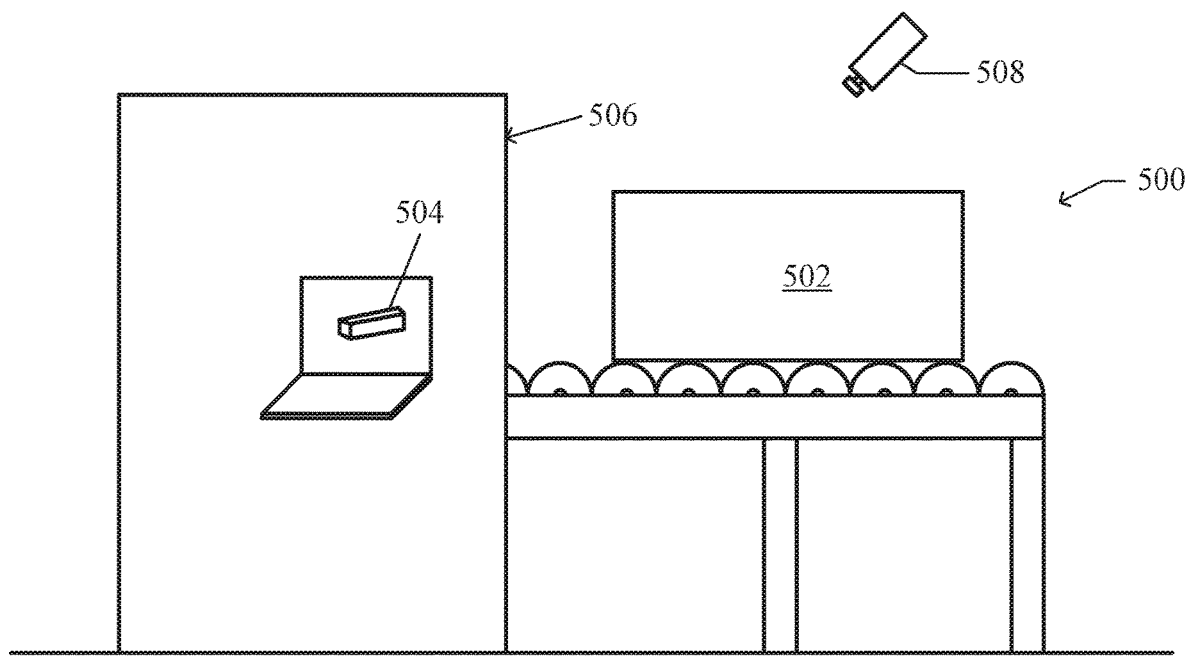
FIG. 5 includes an elevation view of a process for manufacturing controls in accordance with an embodiment.

In another embodiment, systems and processes described herein may be used to control one or more manufacturing processes associated with the manufacture of a manufactured building material. In yet a further embodiment, the system may be used to set initial settings of a manufacturing process such as a benchmark or initial process standard for manufacturing. Referring to FIG. 5, a system 500 may include a process whereby a manufactured building material 502 is compared to a rendered image 504 of the building material for purpose of controlling the manufacturing process. The ΔE of the manufactured building material 502 may be compared to the ΔE of the rendered building material to determine if the dE therebetween meets an acceptable tolerance. For example, manufacturing processes having high tolerance (i.e., where color accuracy is less important) may permit a dE of 3, while other manufacturing processes having small tolerance requirements (i.e., where color accuracy is important) may not accept a dE greater than 0.5.

The system 500 may include an equipment 506 where the manufactured building material 502 is manufactured. In an embodiment, the equipment 506 can include one or more pieces of interconnected equipment. In another embodiment, the equipment 506 may include two or more pieces of equipment integrated by an operator working in the system 500. In an embodiment, the operator may physically pass the manufactured building material 502 between the at least two or more pieces of equipment.

In an embodiment, a sensing element 508 may sense an attribute of the manufactured building material 502, such as for example, a color, a shadowing, a shape, a texture, a size, any other suitable attribute of the manufactured building material 502, or a combination thereof. The sensing element 508 may include a camera, a machine vision system, an acoustic device, radar, beta gauge, or any other suitable sensing device. The system 500 can compare a received data from the sensing element 508 and compare the measured attribute of the manufactured building material 502 to the rendered image 504. The system 500 can further measure ΔE of the manufactured building material 502, or even a dE of the manufactured building material 502 with respect to the building material in the rendered image 504.

In an embodiment, the system 500 may generate an alert when the dE is greater than a selected value (e.g., when dE is greater than 0.5). The alert may signal to an operator that a phase of the manufacturing process is broken or requires attention. In an embodiment, the alert may include at least one of an auditory alert, a visual alert, a vibrational alert, an olfactory alert, a temperature alert, or a chemical-based alert. In an embodiment, upon receipt of the alert, the operator may terminate the manufacturing process. In another embodiment, the system may be adapted to automatically terminate the manufacturing process upon generation of the alert. In yet a further embodiment, the system may be adapted to automatically adjust a manufacturing process associated with the manufactured building material upon generation of the alert. For example, by way of a non-limiting example, if color accuracy deviates by too great a dE, the system can automatically adjust one or more manufacturing processes to reduce the dE. Alternatively, the system may formulate a recommendation for adjusting the system which an operator can accept or further modify to correct the manufacturing phase.

Generation of the alert may permit a closed loop system. In closed loop systems the manufacturing process can be checked for accuracy, thereby reducing tolerancing issues typically associated with manufacturing processes.

In a particular instance, the system 500 may indicate the deviation of the parameter beyond the selected value. That is, the system 500 may display a quantified deviation of the parameter, or the dE, to the user.

In an embodiment, the system 500 can maintain a log associated with the manufacturing process. More particularly, the system 500 can maintain a log of dE as measured over successive manufactured building materials 502. The operator may access the log, for example, to determine the manufacturing process problem and in an attempt to find a correction.

In an embodiment, the system 500 may not include the equipment 506. In such embodiment, the system 500 may be spaced apart from the equipment 506. That is, the equipment can be disposed at a remote location with respect to the equipment. In another embodiment, at least a portion of the equipment 506 may be disposed adjacent to the system 500.

Figure 6:
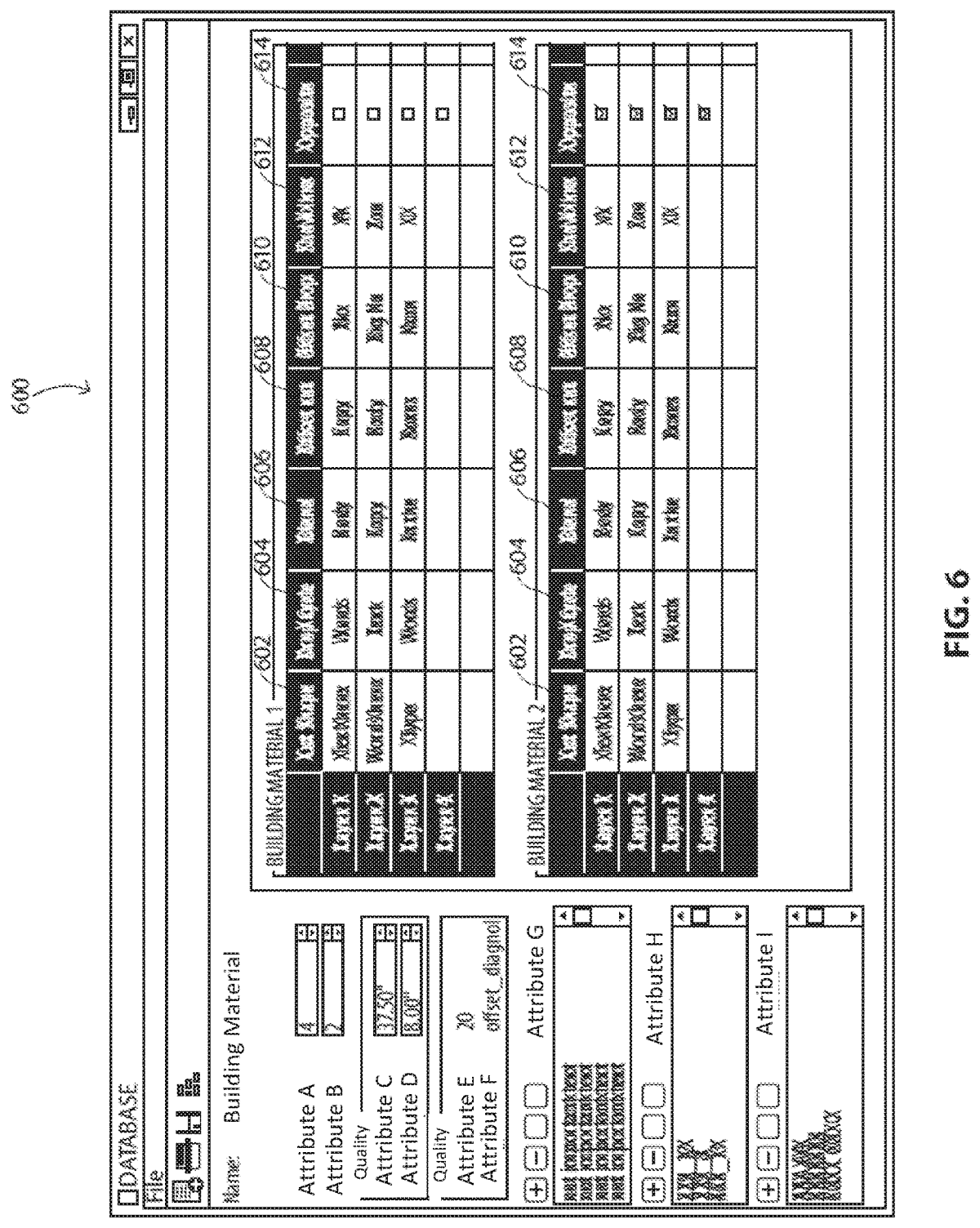

Referring to FIG. 6, and in accordance with an exemplary embodiment, the database 600 can include a first entry 602 defining a first parameter of the contemplated building material, such as a building material name. A second entry 604 can define a second parameter of the contemplated building material; a third entry 606 can define a third parameter of the contemplated building material; a fourth entry 608 can define a fourth parameter of the contemplated building material; a fifth entry 610 can define a fifth parameter of the contemplated building material; a sixth entry 612 can define a sixth parameter of the contemplated building material; a seventh entry 614 can define a seventh parameter of the contemplated building material, and so on. The database may include less than seven parameters for at least one building material. For example, the database may include two parameters, three parameters, four parameters, five parameters, six parameters, seven parameters, eight parameters, nine parameters, ten parameters, fifteen parameters, twenty parameters, twenty-five parameters, fifty parameters, or one-hundred parameters. Moreover, the database may include a number of parameters for at least one building material within a range between and including any of the number of parameters listed above, between and including, one parameter and one-hundred parameters. In another embodiment, the database may include greater than one-hundred parameters. In a further embodiment, the database may include no greater than one-hundred thousand parameters, or no greater than ten-thousand parameters.

Figure 7:
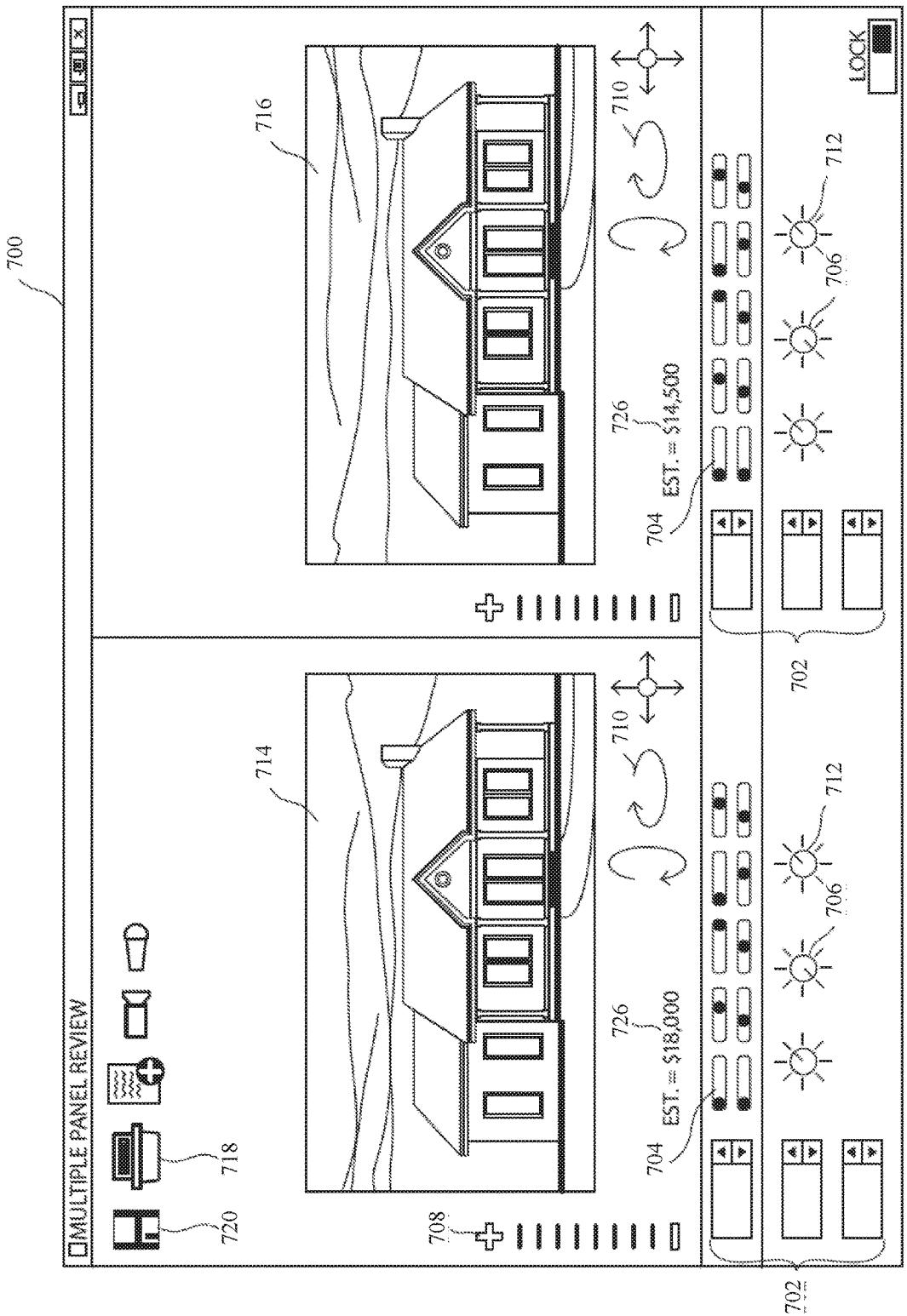
FIG. 7 includes an illustration of a multiple panel review in accordance with an embodiment.

Multiple panel review 700, such as illustrated for example in FIG. 7, may permit simultaneous viewing and comparison of different rendered images (e.g., images 714 and 716), each including different contemplated building materials 722 on the same, or different, building, or in different spaces of the same building. In a particular instance, the rendered images displayed in the multiple panels can be simultaneously adjusted through selection and adjustment of one or more of the parameters described above. For example, the user may adjust a luminance parameter (included in one or more selectable toggles or parameter adjustment switches 702) within the interface which simultaneously adjusts the luminance parameter in all rendered images equally. In another instance, the user can selectively adjust each rendered image differently, for example, adjusting the luminance 704 in the first rendered image 714 and adjusting an environmental condition 706 in a second rendered image 716.

In an embodiment, the user can zoom 708, adjust viewing angle 710, move the rendered image, add one or more predefined filters 712, or otherwise manipulate the rendered image. After a desired viewing angle is achieved, the user may optionally memorialize the rendered image, for example, by printing 718 the rendered image on a substrate, such as a sheet or continuous feed of paper, cardboard, rigid stock, semi-rigid material, or other suitable flexible material. Alternatively, or in addition thereto, the user may save 720 the rendered image on a portable storage device, such as a FLASH system. In an embodiment, the rendered image may also be saved in a storage element for later viewing. In yet a further embodiment, the rendered image may be printed via a 3-dimensional printing assembly.

In an embodiment, the system may further generate a cost estimate 726 for the user. That is, the system may provide an ongoing cost estimate given the type and amount of specific material being applied to the building. In one embodiment, the cost estimate is for the building material itself on a unit basis. In another embodiment, the cost estimate is for the amount of the building material to be used in a building construction project having the parameters associated with the structure depicted in the rendered image. In yet another embodiment, the cost estimate is for the building material and the installation of such a building material on the structure depicted in the rendered image.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A system for rendering a building material comprising: a database including an adjustable parameter relating to a characteristic of a contemplated building material, wherein the system is adapted to provide a rendered image of the contemplated building material, wherein the system is adapted to be used in conjunction with manufacturing of the building material, and wherein the rendered image has a $\Delta E$, as measured according to a Color Test with respect to the building material, of less than 10, less than 8, less than 6, less than 5, less than 4, less than 3, less than 2, or even less than 1.

Embodiment 2. A system for rendering a building material comprising: a database including an adjustable parameter relating to a characteristic of a contemplated building material, wherein the system is adapted to provide a rendered image of the contemplated building material, wherein the system is adapted to be used in conjunction with manufacturing of the building material, and wherein the rendered image has a shadow accuracy, as measured according to a Shadowing Test with respect to the building material, of at least 75%, at least 80%, at least 90%, or even at least 95%.

Embodiment 3. A system for rendering a building material comprising: a database including an adjustable parameter relating to a characteristic of a contemplated building material;

a logic element adapted to generate a rendered image of the contemplated building material upon receiving the adjustable parameter from the database; and a user interface adapted to display the rendered image.

Embodiment 4. A method of rendering a building material comprising: providing a logic element and a database, the database including an adjustable parameter relating to a characteristic of a contemplated building material; adjusting the adjustable parameter; sending data associated with the contemplated building material to the logic element; and the logic element receiving the data and generating a rendered image of the contemplated building material.

Embodiment 5. The system or method according to any one of the preceding embodiments, wherein the system is used to design a new building material.

Embodiment 6. The system or method according to any one of the preceding embodiments, wherein a user modifies the adjustable parameter in response to viewing the rendered image, and wherein an updated rendered image of a modified building material is generated having parameters associated with the modified adjustable parameter.

Embodiment 7. The system or method according to embodiment 6, wherein the updated rendered image has a ΔE, as measured according to a Color Test with respect to the modified building material having parameters associated with the modified adjustable parameters, of less than 10, less than 8, less than 6, less than 5, less than 4, less than 3, less than 2, or even less than 1.

Embodiment 8. The system or method according to any one of embodiments 6 and 7, wherein the updated rendered image has a shadow accuracy, as measured according to a Shadowing Test with respect to the modified building material having parameters associated with the modified adjustable parameters, of at least 75%, at least 80%, at least 90%, or even at least 95%.

Embodiment 9. The system or method according to any one of embodiments 6-8, wherein a dE of the rendered image and the modified rendered image, as measured by a comparison of the ΔE of each of the rendered image and modified rendered image, is less than 5, less than 4, less than 3, less than 2, less than 1.

Embodiment 10. The system or method according to any one of embodiments 1-4, wherein the system is used to control manufacture of a manufactured building material or set initial settings of a manufacturing process.

Embodiment 11. The system or method according to any one of embodiments 1-4 and 10, wherein a dE of a manufactured building material having parameters associated with the adjustable parameter and the rendered image of the building material, as measured by a comparison of the ΔE of each of the rendered image and manufactured building material, is less than 5, less than 4, less than 3, less than 2, less than 1.

Embodiment 12. The system or method according to any one of embodiments 1-4 and 10, wherein the system is adapted to generate an alert when a dE, as measured between the ΔE of a manufactured building material and the rendered image, is greater than 1, greater than 2, greater than 3, greater than 4, greater than 5, greater than 10.

Embodiment 13. The system or method according to embodiment 12, wherein the alert is at least one of an auditory alert, a visual alert, a vibrational alert, an olfactory alert, a temperature alert, or a chemical-based alert.

Embodiment 14. The system or method according to any one of embodiments 12 and 13, wherein the system is adapted to automatically terminate, suspend, or alter a manufacturing process associated with the manufactured building material upon generation of the alert, or wherein the system is adapted to automatically adjust a manufacturing process associated with the manufactured building material upon generation of the alert.

Embodiment 15. The system or method according to any one of embodiments 12-14, wherein the system is adapted to display to a user a data associated with the alert, wherein the system is adapted to display a quantified deviation of a parameter of the manufactured building material with respect to the rendered image.

Embodiment 16. The system or method according to any one of embodiments 10-15, wherein at least a portion of the system is disposed adjacent to a manufacturing process being monitored, wherein at least a portion of the system is disposed remotely from a manufacturing process being monitored.

Embodiment 17. The system or method according to any one of embodiments 10-16, wherein the system is adapted to maintain a log associated with the parameters of each of the manufactured building materials, and wherein a user may view the log to determine a manufacturing process correction.

Embodiment 18. The system or method according to any one of the preceding embodiments, wherein a characteristic of the rendered image is adjustable by modifying the adjustable parameter.

Embodiment 19. The system or method according to any one of the preceding embodiments, wherein the system is adapted to render a first rendered image and a second rendered image, different from the first rendered image, by adjusting at least one adjustable parameter in the database, and wherein a dE of the two renderings, as measured by a comparison of the ΔE of each of the at least two rendered images, is less than 5, less than 4, less than 3, less than 2, less than 1.

Embodiment 20. The system or method according to any one of embodiments 2-4, wherein the rendered image has a ΔE, as measured according to a Color Test with respect to the contemplated building material having parameters associated with the adjustable parameters, of less than 10, less than 8, less than 6, less than 5, less than 4, less than 3, less than 2, or even less than 1.

Embodiment 21. The system or method according to any one of embodiments 1-4, wherein the system or method is adapted to generate at least two rendered images under different illumination conditions, wherein the at least two rendered images have a relative dE, as measured by a comparison of the ΔE of each of the at least two rendered images, each as measured according to a Color Test, of less than 8, 7, 6, 5, 4, 3, 2, or 1.

Embodiment 22. The system or method according to any one of embodiments 1, 3, and 4, wherein the rendered image has a shadow accuracy, as measured according to a Shadowing Test, of at least 75%, at least 80%, at least 90%, or even at least 95%.

Embodiment 23. The system or method according to any one of the preceding embodiments, wherein the adjustable parameter comprises a solar reflectance parameter; a near infrared reflectance parameter; a material planarity measurement describing the area of the building material having a planar surface per unit area; macroscopic surface roughness patterning; average surface roughness; relative color within a predefined, controlled environmental setting such as a laboratory setting; reflection spectra; chroma; hue; luminance; gloss; contrast; material type; color probability defining a probable color for each granule type of material at every possible location along the building material; a material height or depth; granules spatial arrangement and light trapping model information; light scattering properties; or a combination thereof.

Embodiment 24. The system or method according to any one of the preceding embodiments, wherein the system or method further comprises a logic element, and wherein the logic element is adapted to generate the rendered image upon receiving the adjustable parameter from the database.

Embodiment 25. The system or method according to embodiment 24, wherein the logic element is disposed at a remote location with respect to the user interface, wherein the logic element is proximate to the user interface, wherein the logic element is proximate to a manufacturing process.

Embodiment 26. The system or method according to any one of the preceding embodiments, wherein the rendered image is generated at a remote location with respect to the user interface, wherein the rendered image is generated and transmitted to the user interface.

Embodiment 27. The system or method according to any one of embodiments 1-24, wherein the rendered image is generated at a location proximate to the user interface.

Embodiment 28. The system or method according to any one of the preceding embodiments, wherein the logic element is in wireless communication with the user interface.

Embodiment 29. The system or method according to any one of the preceding embodiments, wherein the logic element is connected to the user interface by a wireless communication protocol.

Embodiment 30. The system or method according to embodiment 29, wherein the wireless communication protocol comprises a LAN, an HTTP protocol, an HTTPS protocol, or a combination thereof.

Embodiment 31. The system or method according to any one of embodiments 1-27, wherein the logic element is connected to the user interface by a wired protocol, such as a signal-conducting wire, fiber optics, or another suitable element.

Embodiment 32. The system or method according to any one of the preceding embodiments, wherein the logic element is operatively coupled to the user interface.

Embodiment 33. The system or method according to any one of the preceding embodiments, wherein the logic element and the user interface are coupled directly together.

Embodiment 34. The system or method according to any one of the preceding embodiments, wherein the logic element and the user interface are connected together with one or more intervening components.

Embodiment 35. The system or method according to embodiment 34, wherein the one or more intervening components comprise, a relay, a wireless communication device, or a combination thereof.

Embodiment 36. The system or method according to any one of the preceding embodiments, wherein the user interface comprises a liquid crystal display, a light-emitting diode, an organic light-emitting diode display, a plasma display, another similar display, or any combination thereof.

Embodiment 37. The system or method according to any one of the preceding embodiments, wherein the user interface is mobile, wherein the user interface comprises a personal communication device, wherein the user interface comprises a smart phone.

Embodiment 38. The system or method according to any one of the preceding embodiments, wherein the user interface comprises a monitor of a personal computer.

Embodiment 39. The system or method according to any one of the preceding embodiments, wherein the logic element comprises one or more central processing units, wherein the logic element comprises a microprocessor, a microcontroller, or a combination thereof.

Embodiment 40. The system or method according to any one of the preceding embodiments, wherein the system or method further comprises a storage element in communication with the logic element, and wherein the storage element is adapted to store data relating to the adjustable parameter.

Embodiment 41. The system or method according to embodiment 40, wherein the storage element comprises a magnetic data storage system, an optical system, a FLASH system, or a combination thereof.

Embodiment 42. The system or method according to any one of embodiments 40 and 41, wherein the storage element is coupled to the logic element through a wired protocol.

Embodiment 43. The system or method according to any one of embodiments 40 and 41, wherein the storage element is coupled to the logic element through a wireless protocol, a fiber optic protocol, or through an optical protocol.

Embodiment 44. The system or method according to any one of the preceding embodiments, wherein the adjustable parameter is adjustable.

Embodiment 45. The system or method according to any one of the preceding embodiments, wherein the adjustable parameter comprises a first adjustable parameter and a second adjustable parameter, and wherein the first and second adjustable parameters are different from one another.

Embodiment 46. The system or method according to embodiment 45, wherein the first adjustable parameter is an initial parameter as first entered into the database, and wherein the second adjustable parameter is an updated parameter as adjusted within the database.

Embodiment 47. The system or method according to any one of embodiments 45 and 46, wherein the system or method is adapted to generate an updated rendered image in response to changes between the first and second adjustable parameters.

Embodiment 48. The system or method according to any one of embodiments 45-47, wherein the first adjustable parameter has a first value, wherein the second adjustable parameter has a second value, and wherein the ratio [first value/second value] is greater than 1, greater than 1.1, greater than 1.2, greater than 1.3, greater than 1.4, greater than 1.5, greater than 2, greater than 3, or greater than 5.

Embodiment 49. The system or method according to any one of embodiments 45-47, wherein the first adjustable parameter has a first value, wherein the second adjustable parameter has a second value, and wherein the ratio [first value/second value] is less than 1000, less than 100, less than 10, less than 9, less than 8, less than 7, or less than 6.

Embodiment 50. The system or method according to any one of the preceding embodiments, wherein the adjustable parameter is adjustable by a user selection.

Embodiment 51. The system or method according to any one of the preceding embodiments, wherein a user can manually adjust the adjustable parameter.

Embodiment 52. The system or method according to any one of the preceding embodiments, wherein the adjustable parameter comprises at least one adjustable parameter, at least two adjustable parameters, at least three adjustable parameters, at least four adjustable parameters, at least five adjustable parameters, at least ten adjustable parameters, at least twenty adjustable parameters, at least fifty adjustable parameters, or at least 100 adjustable parameters.

Embodiment 53. The system or method according to any one of the preceding embodiments, wherein the adjustable parameter is entered into the database by: locating an appropriate section of the database for entrance of a data; and recording the data into the appropriate section of the database.

Embodiment 54. The system or method according to embodiment 53, further comprising: measuring a data associated with the adjustable parameter, wherein measuring the data is performed before entering the data into the appropriate section of the database.

Embodiment 55. The system or method according to embodiment 54, wherein measuring the data is performed by a user, wherein measuring the data is performed by a logic element.

Embodiment 56. The system or method according to any one of embodiments 54 and 55, wherein measuring the data is performed by measuring a characteristic of a building material.

Embodiment 57. The system or method according to any one of embodiments 53-56, further comprising: locating a second location of the database for entrance of a further data; recording the further data into the second location of the database.

Embodiment 58. The system or method according to embodiment 57, wherein the further data pertains to a same characteristic of the building material as compared to the data.

Embodiment 59. The system or method according to any one of embodiments 57 and 58, wherein measuring the further data is performed by measuring a characteristic of a building material.

Embodiment 60. A system for rendering a building material comprising: a database including an adjustable parameter relating to a characteristic of a contemplated building material, wherein the system is adapted to provide a rendered image of the contemplated building material, the rendered image having a ΔE, as measured according to a Color Test with respect to the contemplated building material having parameters associated with the adjustable parameters, of less than 10, less than 8, less than 6, less than 5, less than 4, less than 3, less than 2, or even less than 1.

Embodiment 61. A system for rendering a building material comprising: a database including an adjustable parameter relating to a characteristic of a contemplated building material, wherein the system is adapted to provide a rendered image of the contemplated building material, the rendered image having a shadow accuracy, as measured according to a Shadowing Test with respect to the contemplated building material having parameters associated with the adjustable parameters, of at least 75%, at least 80%, at least 90%, or even at least 95%.

Note that not all of the features described above are required, that a portion of a specific feature may not be required, and that one or more features may be provided in addition to those described. Still further, the order in which features are described is not necessarily the order in which the features are installed.

Certain features are, for clarity, described herein in the context of separate embodiments, may also be provided in combination in a single embodiment. Conversely, various features that are, for brevity, described in the context of a single embodiment, may also be provided separately or in any sub-combinations.

Benefits, other advantages, and solutions to problems have been described above with regard to specific embodiments, However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any sub-combination. Further, reference to values stated in ranges includes each and every value within that range, including the end range values referenced. Many other embodiments may be apparent to skilled artisans only after reading this specification. Other embodiments may be used and derived from the disclosure, such that a structural substitution, logical substitution, or any change may be made without departing from the scope of the disclosure. Accordingly, the disclosure is to be regarded as illustrative rather than restrictive.

What is claimed is:

1. A system for rendering a building material, comprising:
   a database including a list of selectable building materials and at least one adjustable parameter relating to a characteristic of one or more of the selectable building materials;
   a logic element adapted to allow selection of a building material from the list of selectable building materials, access a digitally masked photograph of a building that divides the building into a plurality of digitally masked surfaces or locations, allow selection of one or more of the plurality of digitally masked surfaces or locations on the digitally masked photograph of the building onto which the selected building material is to be rendered, and generate a rendered image of the selected building material on the one or more selected digitally masked surfaces or locations on the digitally masked photograph of the building upon receiving the selected building material and the adjustable parameter from the database; and
   a user interface adapted to display the rendered image.

2. The system of claim 1, wherein the logic element is disposed at a remote location with respect to the user interface and operatively connected to the user interface by a wireless communication protocol.

3. The system of claim 2, wherein the rendered image is generated at the remote location with respect to the user interface and transmitted to the user interface.

4. The system of claim 3, wherein the user interface comprises at least one of a personal communication device and a monitor of a personal computer.

5. The system of claim 1, wherein the adjustable parameter comprises at least one of a solar reflectance parameter, a near infrared reflectance parameter, a material planarity measurement, a macroscopic surface roughness patterning, an average surface roughness, a reflection spectra, a chroma, a hue, a luminance, a gloss, a contrast, a material type, a color probability, a material height, a material depth, a shape, a cut line, a surface, a granule spatial arrangement, a light trapping characteristic, and a light scattering property.

6. The system of claim 1, wherein the adjustable parameter is adjustable.

7. The system of claim 6, wherein the logic element is adapted to generate an updated rendered image of the contemplated building material in response to a modification of the adjustable parameter.

8. The system of claim 7, further comprising: a storage element in communication with the logic element, wherein the storage element is configured to store data relating to the adjustable parameter.

9. The system of claim 1, further comprising: a plurality of adjustable parameters.

10. The system of claim 1, wherein the system is used to design a new building material.

11. The system of claim 1, wherein the adjustable parameter comprises at least one of a material blending of colored granules, a shaping cut line or surface, a three-dimensional shape of a mold or embossing wheel, a texture of a transfer roll, a paint type, and a delineation of a specific formation process.

12. The system or method according to claim 1, wherein the system is used to control manufacture of a manufactured building material or set initial settings of a manufacturing process.

13. A method of rendering a building material, comprising:
providing a logic element and a database, the database including a list of selectable building materials and at least one adjustable parameter relating to a characteristic of one or more of the selectable building materials, and the logic element having access to a digitally masked photograph of a building that divides the building into a plurality of digitally masked surfaces or locations;
selecting a building material from the list of selectable building materials;
adjusting the adjustable parameter;
sending data associated with the selected building material and the adjustable parameter to the logic element;
accessing the digitally masked photograph of the building;
selecting one or more of the plurality of digitally masked surfaces or locations on the digitally masked photograph of the building onto which the selected building material is to be rendered; and
generating a rendered image of the selected building material on the one or more selected digitally masked surfaces or locations on the digitally masked photograph of the building in response to the logic element receiving the data associated with the selected building material and the adjustable parameter.

14. The method of claim 13, further comprising: selecting the building material to be rendered from the digitally masked photograph of a building.

15. The method of claim 14, wherein the building material comprises at least one of roofing, siding, fencing, railing, decking, flooring, ceiling material, wall material, blinds, molding, shelving, stucco, mortars, renders, siding, decking, masonry, and synthetic or simulated masonry.

16. The method of claim 14, further comprising: adjusting a second adjustable parameter.

17. The method of claim 16, wherein the rendered image of the contemplated building material comprises attributes associated with the at least one adjustable parameter and the second adjustable parameter.

18. The method of claim 17, further comprising: generating at least one of an auditory alert, a visual alert, a vibrational alert, an olfactory alert, a temperature alert, or a chemical-based alert when the at least one adjustable parameter and the second adjustable parameter are incompatible.

19. The method of claim 14, wherein the rendered image comprises a color accuracy and a shadow accuracy that accurately simulates the building material.

20. The method of claim 13, further comprising: modifying the adjustable parameter in response to viewing the rendered image, and generating a second rendered image of the contemplated building material in accordance with the modified adjustable parameter.

21. The method of claim 20, further comprising: simultaneous displaying the rendered image and the second rendered image having different contemplated building materials on a user interface.

22. The method of claim 13, further comprising: adjusting one or more environmental conditions of the rendered image to view the contemplated building material in a range of simulated environmental conditions.

* * * * *